United States Patent [19]

Jensen et al.

[11] 4,341,963
[45] Jul. 27, 1982

[54] INTEGRATED CIRCUIT FOR CHIP OP/AMP INTERFACE

[75] Inventors: Arthur S. Jensen; Keefer S. Stull, Jr., both of Baltimore, Md.

[73] Assignee: Westinghouse Electric Corp., Pittsburgh, Pa.

[21] Appl. No.: 163,549

[22] Filed: Jun. 27, 1980

[51] Int. Cl.³ .............................................. G06G 7/12
[52] U.S. Cl. .............................. 307/497; 307/221 D; 307/475; 330/253; 330/307
[58] Field of Search .............................. 330/253, 307; 327/221 D, 475, 497

[56] References Cited

U.S. PATENT DOCUMENTS 4,126,836 11/1978 Carnes et al. .............. 307/221 D X Primary Examiner—James B. Mullins
Attorney, Agent, or Firm—R. M. Trepp

[57] ABSTRACT

An integrated circuit including a charge-coupled device for accumulating charge in a potential well and pair of metal-oxide semiconductor (MOS) transistors connected to form a differential amplifier. The gate of one transistor is coupled to the CCD potential well. The integrated circuit is provided with means for coupling the differential outputs, the drain of each transistor of the differential amplifier, to the differential inputs of an external op amp. Means are provided for coupling electrical feedback from the output of the op amp to the gate of the second transistor of the differential amplifier.

3 Claims, 3 Drawing Figures

INTEGRATED CIRCUIT FOR CHIP OP/AMP INTERFACE

BACKGROUND OF THE INVENTION

1. Field of the Invention

This invention relates to circuits for interfacing integrated circuit outputs to circuitry external to the integrated circuit, and, more particularly, to circuits for interfacing the outputs of charge-coupled devices to external operational amplifiers.

2. Description of the Prior Art

At the output of a CMOS, PMOS, or NMOS integrated circuit chip, it is common to use an electrometer MOSFET in an emitter-follower mode as a current input to an off-chip inverting operational amplifier (op-amp). Such a configuration is particularly common in integrated circuit chips having a linear or area array of photodiode detectors, having a charge-coupled device (CCD) detector array, or having a CCD for data processing.

However, such a circuit connection having a length on the order of ½" results in a rather large stray capacitance-to-ground at the inverting input to the op-amp. This stray capacitance arises from the bonding pads and the wire bonds between the chips, and introduces a zero (i.e., a factor in the numerator) in the transfer function for the op-amp input voltage noise. This causes the high-frequency portion of this noise to be boosted to the point where this op-amp noise is the limiting factor in the circuit performance.

In addition, the output signal amplitude is a direct function of the electrometer transconductance. Since the electrometer transconductance is sensitive to temperature, the output signal amplitude will vary accordingly. This makes the matching of output signal from channel-to-channel very difficult since temperatures are likely to vary from channel-to-channel.

Accordingly, it is desirable to provide a chip/op-amp interface circuit with a reduced stray capacitance and having an output signal amplitude relatively insensitive to temperature variations.

SUMMARY OF THE INVENTION

An integrated circuit comprises a semiconductor substrate including therein signal means for providing an electrical output signal, which signal means is coupled to a differential amplifier which is also disposed in the substrate. Means are included on the substrate for coupling the outputs of the differential amplifier to the inputs of an external operational amplifier. And, means on the substrate are included for coupling a feedback circuit between an output of the external operational amplifier and an inverting input of the differential amplifier.

Since the feedback loop of the operational amplifier goes around the differential amplifiers they become a part of the feedback loop. Hence, the differential amplifiers and all the lumped circuit constants associated with them are subject to the usual degenerative action of negative feedback and their characteristics have only a second order effect on the circuit operation.

In greater detail, the signal means includes a charge-coupled device (CCD) in the substrate comprising a potential well means for accumulating electrical charge. The differential amplifier includes a pair of metal-oxide-semiconductor (MOS) transistors having differential (inverting and noninverting) inputs, differential outputs, and a common source region. Means are included for providing external access to the differential outputs of the differential amplifier, to the inverting input of the differential amplifier, and to the common source region of the differential amplifier.

External circuitry commonly associated with the present invention proper includes means for controlling the transferring and accumulating of charge in the CCD and means for removing the charge accumulated. Common external circuitry also includes an operational amplifier having an output and differential inputs, and includes a feedback circuit associated with the operational amplifier. The differential outputs of the differential amplifier are coupled to the differential inputs of the operational amplifier and the feedback circuit is coupled between the output of the operational amplifier and the inverting input of the differential amplifier.

DESCRIPTION OF THE PREFERRED EMBODIMENT

Figure 1:
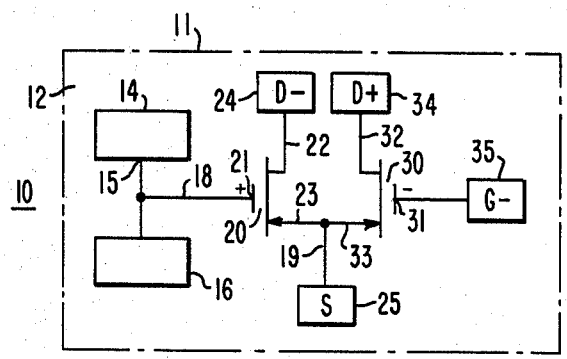
FIG. 1 shows a schematic view of an integrated circuit 10 according to the teachings of the present invention.

FIG. 1 shows an integrated circuit 10 on a semiconductor substrate 12 within the lines at 11 according to the teachings of the present invention. Formed in the substrate 12 is a charge-coupled potential well 14 having an output 15 for accumulating a quantity of electrical charge. Generally, the potential well 14 is contemplated to include a number of charge-coupled potential wells all of which are effective to transfer and accumulate charge in a single output potential well. The integrated circuit 10 also includes means 16 formed in the substrate 12 for resetting the potential well 14, that is, for removing charge accumulated in the well 14.

A pair 20 and 30 of metal-oxide-semiconductor (MOS) transistors are formed in the substrate 12 coupled together differentially to provide inverting and noninverting inputs and outputs. Specifically, transistor 20 includes a noninverting gate input region 21, and inverting drain output region 22 coupled to a bonding pad 24 on the substrate 12, and a source region 23. Transistor 30 includes an inverting gate input region 31 coupled to a bonding pad 35, a noninverting drain output region 32 coupled to a bonding pad 34 on the substrate 12, and a source region 33. Means 19 formed in the substrate 12 are included for coupling both of the source regions 23 and 33 to a bonding pad 25. Also, means 18 on the order of 50 μm in length and formed in the substrate 12 are included for coupling the output 15 of the potential well 14 to the noninverting gate input 21 of the transistor 20.

Figure 2:
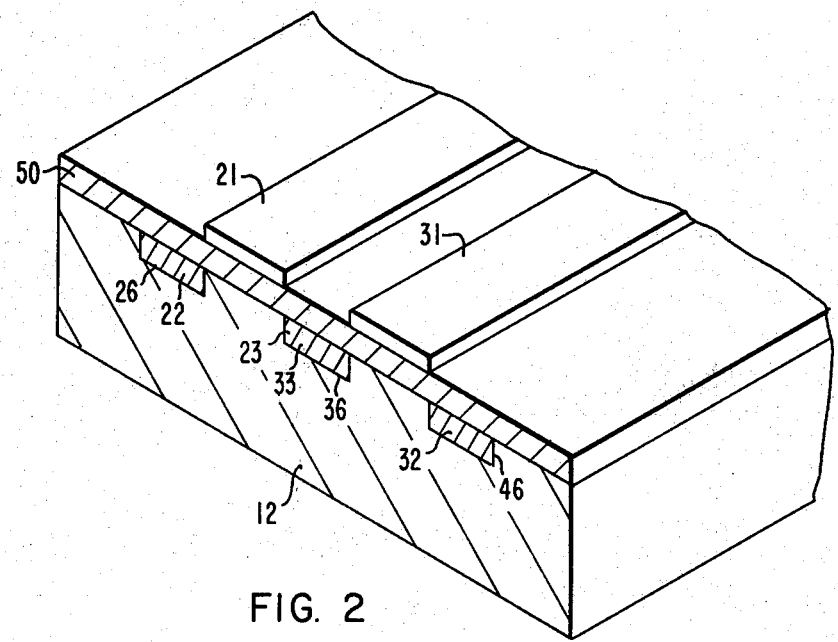
FIG. 2 shows a sectional view of a portion of the integrated circuit of FIG. 1.

FIG. 2 shows a more detailed view of one embodiment of the transistors 20 and 30. In FIG. 2, a sectional view of a portion of the substrate 12 includes therein similar elements of FIG. 1 designated with like reference characters.

In particular, the drain region 22 comprises a semiconductor impurity region disposed in the substrate 12 and forming a p-n junction 26 therewith. The source regions 23 and 33 comprise a common semiconductor impurity region disposed in the substrate 12 spaced apart from the p-n junction 26 and forming a p-n junction 36 with the substrate 12. The drain region 32 comprises a semiconductor impurity region disposed in the substrate 12 and forming a p-n junction 46 therewith. The gate inputs 21 and 31 are each formed by disposing a layer of metal over the substrate 12 and separated therefrom by a layer 50 of insulating material. Specifically, the noninverting gate input 21 is disposed on the layer 50 over the space between the p-n junctions 26 and 36. And, the inverting gate input 31 is disposed on the layer 50 over the space between the p-n junctions 36 and 46. Since the differential transistors 20 and 30 are in such close proximity, they essentially operate at the same temperature, thereby minimizing temperature effects on the output signal.

Figure 3:
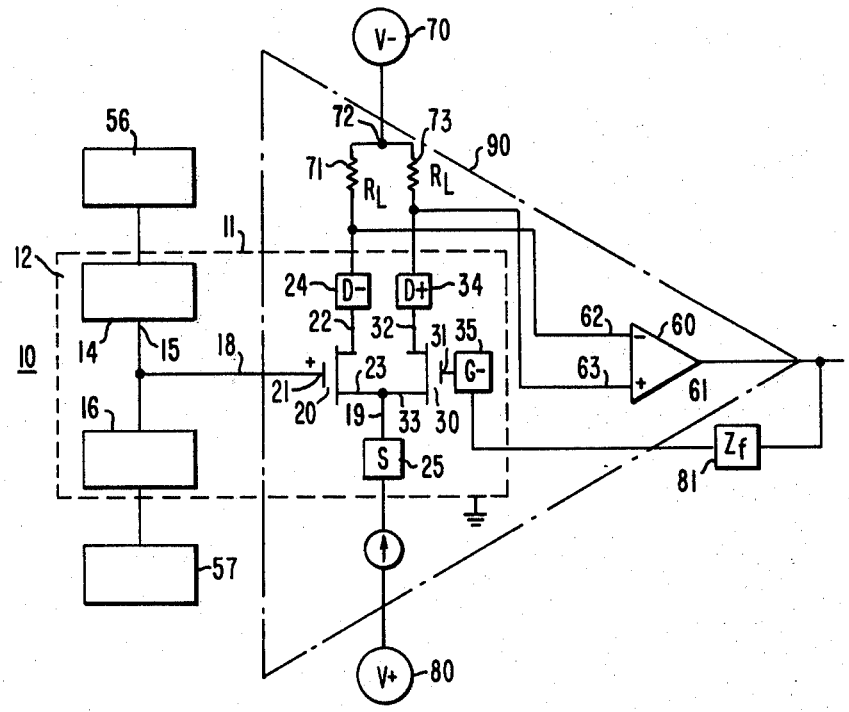
FIG. 3 shows a schematic view of the integrated circuit of FIG. 1 along with block representations of circuitry associated therewith according to the teachings of the present invention.

FIG. 3 shows the integrated circuit 10 of FIG. 1 along with associated output circuitry and block representation of certain control circuitry. The control circuitry includes external means 56 for controlling the transferring and accumulating of charge in the potential well means 14. In addition, external means 57 is included for controlling the removing of charge from the potential wells means 14. The output circuitry associated with the integrated circuit 10 commonly comprises, as shown in FIG. 3 an operational amplifier 60 having an output 61 and having inverting and noninverting inputs 62 and 63, respectively. According to the teachings of the present invention, the operational amplifier 60 is coupled to the integrated circuit 10 such that the noninverting output 32 of the integrated circuit 10 is coupled to the noninverting input 63 of the operational amplifier 60 via the bonding pad 34 and, conversely, the inverting output 22 of the integrated circuit 10 is coupled to the inverting input 62 of the operational amplifier 60 via the bonding pad 24. In addition, a source 70 of potential is coupled to both the noninverting and inverting outputs 32 and 22 via resistors 73 and 71, respectively. The potential source 70 should be negative in cases where the substrate 12 is n-type and should be positive in cases where the substrate 12 is p-type. A source 80 of current is coupled to the common sources 23 and 33 via the bonding pad 25.

For purposes of conceptualization, the "true" op amp boundary in accordance with the teachings of the present invention is within the lines at 90. A feedback circuit 81, normally coupled across the input and output of the operational amplifier 60, is coupled, according to the teachings of the present invention, to the inverting gate input 31 of the transistor 30 via the bonding pad 35. The feedback circuit 81 can comprise, as is common, a parallel RC circuit, which determines the gain and bandwidth from a signal on input gate 21 to a signal on the output 61.

What we claim is:

1. An integrated circuit for coupling an electrical signal in said integrated circuit to an operational amplifier external to said integrated circuit, said operational amplifier including differential inputs and a feedback circuit, said integrated circuit comprising:
   (a) a semiconductor substrate;
   (b) signal means in said substrate for providing an electrical signal;
   (c) differential amplifying means in said substrate;
   (d) means in said substrate for coupling said differential amplifying means to said electrical signal;
   (e) means in said substrate responsive to a set of potentials for including said differential amplifying means within the feedback circuit of said operational amplifier.

2. An integrated circuit for providing an electrical signal to an operational amplifier, said operational amplifier having an output and having inverting and noninverting inputs, said integrated circuit comprising:
   (a) a semiconductor substrate;
   (b) signal means in said substrate for providing an electrical input signal;
   (c) differential amplifying means in said substrate said amplifying means having inverting and noninverting inputs, said inverting and noninverting inputs having noninverting and inverting outputs, respectively associated therewith;
   (d) means in said substrate for coupling said noninverting input to said input signal;
   (e) means in said substrate for coupling said inverting input to the output of said operational amplifier;
   (f) means in said substrate for coupling the noninverting output of said amplifying means to the noninverting input of said operational amplifier;
   (g) means in said substrate for coupling the inverting output of said amplifying means to the inverting input of said operational amplifier; and
   (h) means in said substrate for providing current to said amplifying means from an external current source.

3. An integrated circuit for providing an electrical signal to an operational amplifier, said operational amplifier having an output, having inverting and noninverting inputs, and having a feedback circuit, said integrated circuit comprising:
   (a) a semiconductor substrate;
   (b) charge-coupled means in said substrate for accumulating charge in a potential well;
   (c) differential metal-oxide-semiconductor amplifying means in said substrate, said amplifying means including:
      1. first and second impurity regions in said substrate, said first and second impurity regions forming first and second p-n junctions respectively, with said substrate, said first impurity region comprising a inverting drain output, said second impurity region comprising a common source region,
      2. a first space in said substrate between said first and second impurity regions,
      3. a first metallized region over said first space comprising a noninverting gate input, said first metallized region separated from said substrate by a layer of insulating material,
      4. a third impurity region in said substrate and forming a third p-n junction therewith, said third impurity region comprising a noninverting drain output,
      5. a second space in said substrate between said second and third impurity regions,
      6. a second metallized region over said second space comprising an inverting gate input, said second metallized region separated from said substrate by said layer of insulating material,
   (d) means in said substrate for coupling the noninverting gate input of said amplifying means to said potential well;
   (e) means in said substrate including a first bonding pad and said feedback circuit for coupling the inverting gate input of said amplifying means to the output of said operational amplifier;

(f) means in said substrate including a second bonding pad for coupling the noninverting drain output of said amplifying means to the noninverting input of said operational amplifier;

(g) means in said substrate including a third bonding pad for coupling the inverting drain output of said amplifying means to the inverting input of said operational amplifier; and (h) means in said substrate including a fourth bonding pad for providing current to said common source region.

* * * * *